(12) United States Patent
Chan et al.

(10) Patent No.: US 6,850,460 B1
(45) Date of Patent: Feb. 1, 2005

(54) HIGH PERFORMANCE PROGRAMMABLE ARRAY LOCAL CLOCK GENERATOR

(75) Inventors: Yuen H. Chan, Poughkeepsie, NY (US); Jatinder K. Wadhwa, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/843,991

(22) Filed: May 12, 2004

(51) Int. Cl.[7] .................................................. G11C 8/18
(52) U.S. Cl. ...................................... 365/233; 365/194
(58) Field of Search ................................ 365/154, 156, 365/194, 191, 233

(56) References Cited

U.S. PATENT DOCUMENTS

| | | | |
|---|---|---|---|
| 5,553,276 A | 9/1996 | Dean | 713/500 |
| 5,790,839 A | 8/1998 | Luk et al. | 713/501 |
| 5,841,712 A * | 11/1998 | Wendell et al. | 365/200 |
| 6,282,131 B1 | 8/2001 | Roy | 365/191 |
| 6,392,466 B1 | 5/2002 | Fletcher | 327/392 |

* cited by examiner

*Primary Examiner*—Andrew Q. Tran
(74) *Attorney, Agent, or Firm*—Lynn L. Augspurger; Laurence J. Marhoefer

(57) ABSTRACT

An SRAM array local clock generator has variable delay settings that are programmable via level scan bits. Program bits from the level scan operation are decoded and used to adjust the number of delay elements in the local clock generator path.

5 Claims, 4 Drawing Sheets

CIRCUIT SCHEMATIC OF THE ARRAY LOCAL CLOCK GENERATOR

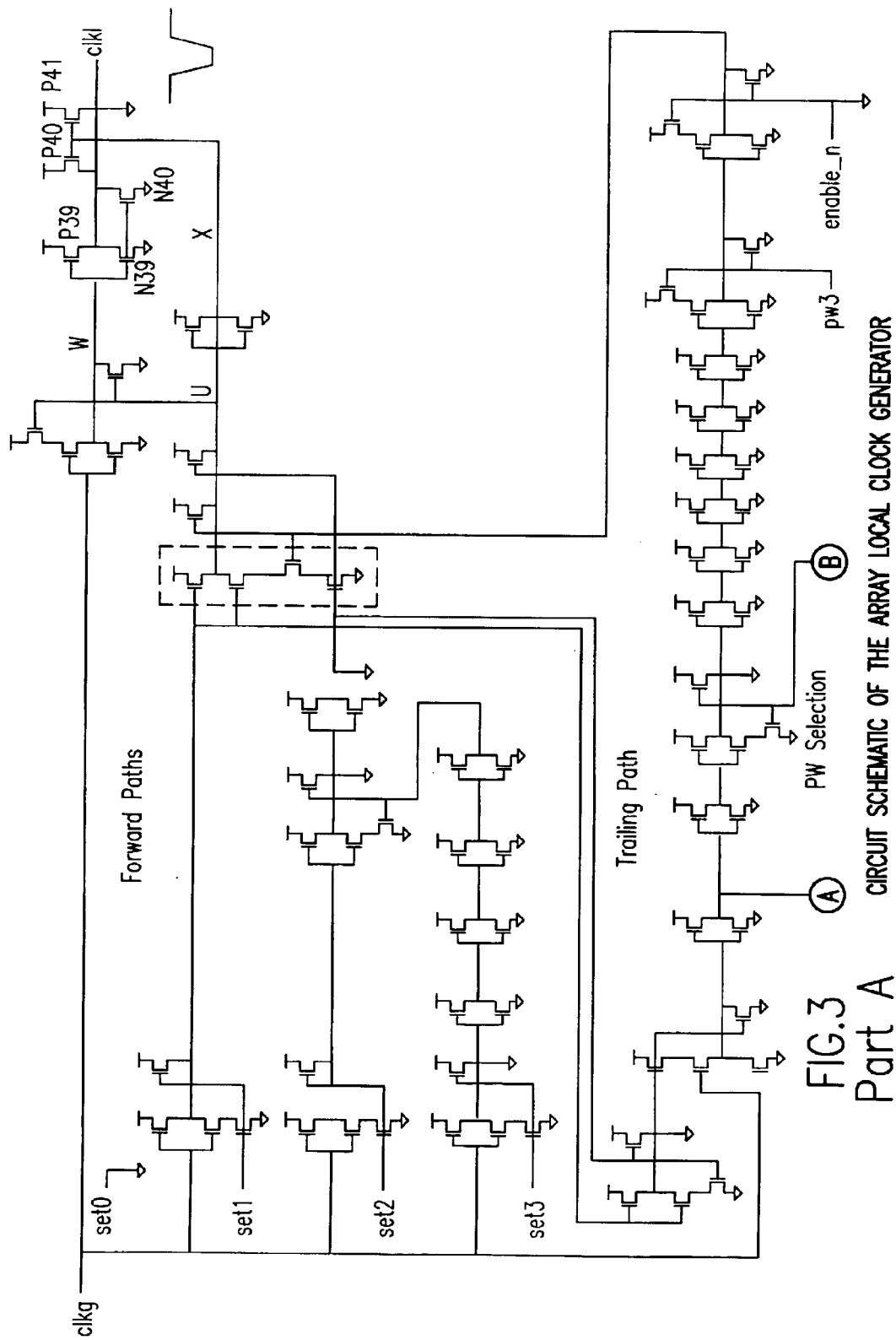
FIG.3 Part A   CIRCUIT SCHEMATIC OF THE ARRAY LOCAL CLOCK GENERATOR

Part B

CIRCUIT SCHEMATIC OF THE ARRAY LOCAL CLOCK GENERATOR

INTERNAL TIMING OF THE "SAE" AND "RSE" SIGNALS

HIGH PERFORMANCE PROGRAMMABLE ARRAY LOCAL CLOCK GENERATOR

RELATED APPLICATIONS

This application is related to the following patent applications filed of even dated herewith, assigned to the assignee of this application, and incorporated by reference herein: Cache Late Select Circuit, Ser. No. 10/844,296; Output Driver With Pulse to Static Converter, Ser. No. 10/844,298; Programmable Sense Amplifier Timing Generator, Ser. No. 10/844,301.

FIELD OF THE INVENTION

This invention relates to an improved programmable local clock generator for use with CMOS static RAM (SRAM), and more particularly to a local clock generator programmable with level scan bits that has a fast response to an external clock signal and high output drive power.

BACKGROUND

High speed SRAM is usually designed so that it is synchronized in its operation. That is, its read write operations are triggered and controlled by clock timing. The local clock generator for the SRAM array is, therefore, a critical part in the SRAM design. High performance SRAM requires an ability to adjust certain timing functions in place in order to allow early mode/late mode timing adjustments, and to adjust internal timing adjustments, which allow high performance with minimum timing margins. In the prior art, such timing adjustments have been implement via fuse links or EPROM.

SUMMARY OF THE INVENTION

An object of this invention is the provision of an SRAM programmable local clock generator that can be easily programmed in place, provides low delay from system clock input to local clock output, and provides high driving power.

Another object of the invention is the provision of an SRAM programmable local clock generator that provides a clock chopper function with variable delay settings to allow for early mode/late mode timing adjustments and also provides variable chopped width pulses to optimize internal SRAM array timing operations.

Briefly, this invention contemplates the provision of an SRAM array local clock generator in which variable delay settings are programmed in place via level SCAN bits. Program bits from the level SCAN operation are decoded and adjust the number of delay elements in the local clock generator path in order to adjust the timing of the leading and trailing edges of the local clock and the width of the local clock pulse.

These and other improvements are set forth in the following detailed description. For a better understanding of the invention with its advantages and features, refer to the description and the drawings.

DESCRIPTIONS OF THE DRAWINGS

DETAILED DESCRIPTION OF THE INVENTION

Figure 1:
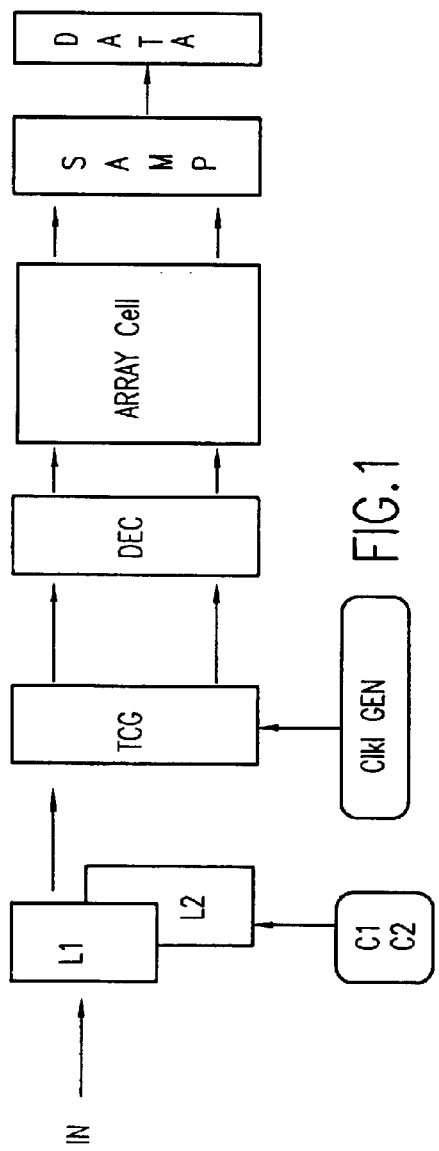
FIG. 1 is a functional block diagram illustrating a state of the art SRAM system employing L1/L2 level SCANS.

FIG. 1 shows a simplified functional diagram of a CMOS SRAM with L1/L2 cycle boundary latches and a local array clock generation (Clkl GEN). In a high performance SRAM array of the type contemplated by this invention, array peripheral circuits, such as addressing, decoding, reading and writing, are designed for operation in response to dynamic pulse signals. The array local clock generator has an external clock, or so called global clock signal, from which internal dynamic timing signals are generated to drive circuits such as an address True-Complement Generator (TCG) and bit and word DEC coders.

Figure 2:
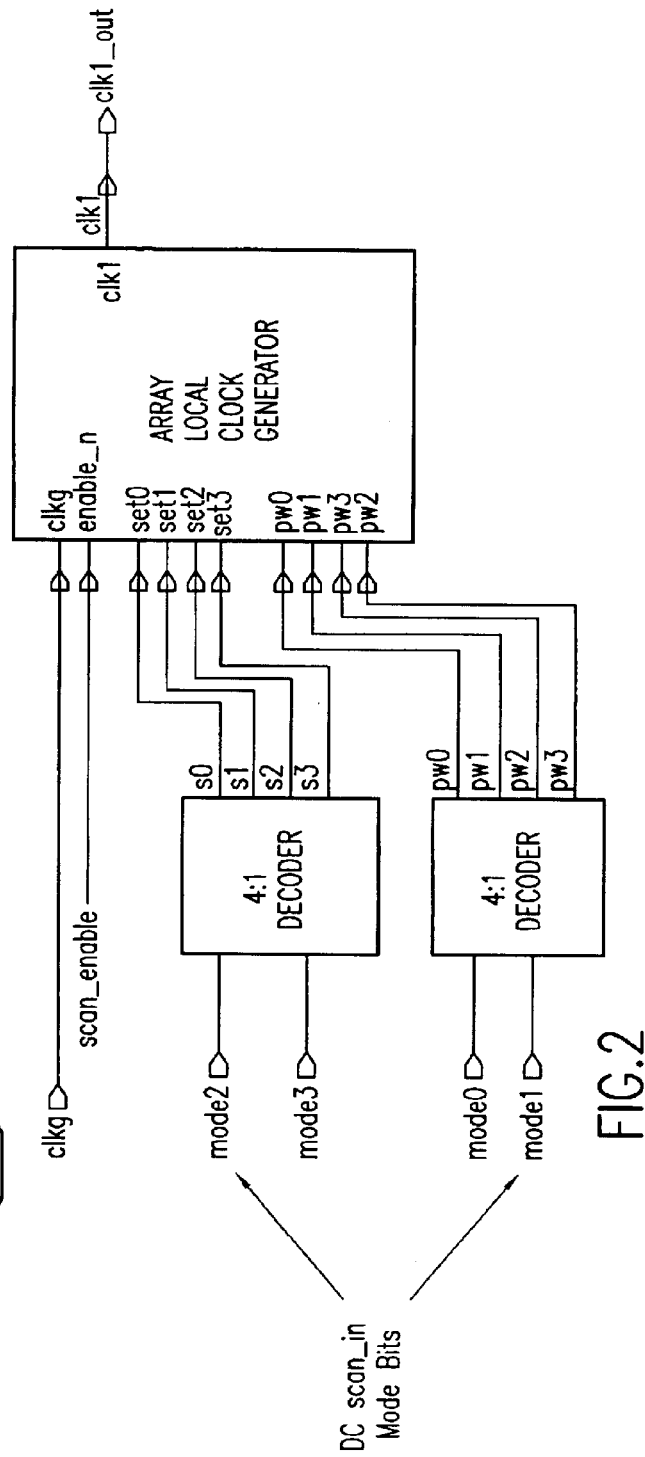
FIG. 2 is a block diagram of a programmable SRAM local clock generator in accordance with the teachings of this invention.

Referring now FIG. 2, the SRAM local clock generator in accordance with this invention has a global clock input (clkg) and a local clock output (clkl_out). It also has a scan enable input (scan_enable), which enables and disables the local clock generation function for system mode or SCAN mode operation. The local clock generator variable timing is controlled from two sets of steady state logic inputs: one is the set0_set3 inputs and the other is the pw0—pw3 inputs. Inputs set0_set3 provide four different delay settings on the clkl_out. Inputs pw0_pw3 determine the output pulse width of clkl_out. It also has four adjustments. The set0_set3 inputs to the clock generator are derived from a 4:1 decoder that has as its inputs mode bit 2 and mode bit 3. Similarly, the pw0_pw3 inputs to the clock generator are derived from another 4:1 decoder that has as its inputs mode bit mode bit 0 and mode bit 1. The mode bit inputs to these decoders are provided respectively four scan only latches (not shown). It will be appreciated that the local clock generator is therefore fully programmable by means of a scan-in initialization process during a power on IPL sequence.

Figure 3:
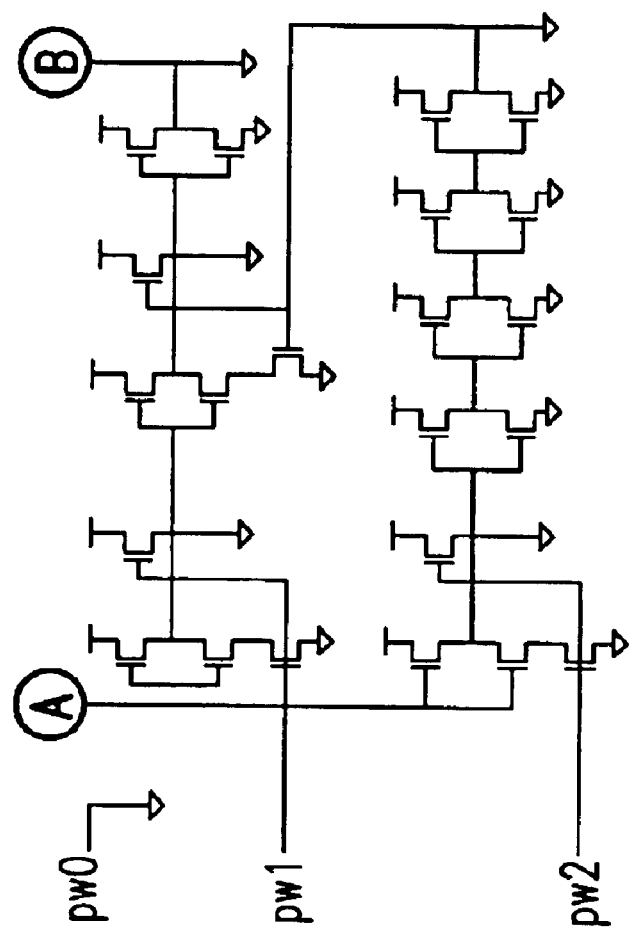
FIG. 3 is schematic diagram of one embodiment of the generator shown in FIG. 3.

Referring now to FIG. 3, it shows a schematic of a specific embodiment of the array local clock generator shown in block form in FIG. 2. The circuit is comprised of three main sections. A forward path section controls the delay from the external clock input (clkg) to the local clock output (clkl) in response to the inputs set0_set3. A trailing path section controls the pulse width of the output clock clkl in response to the inputs pw1_pw3. And a high power output section drives the output clock signal clkl. Here it should be noted the pw3 input disables the clock chopper function and the input labeled enable_n is a scan enable function disables the local clock generator, forcing the output clkl to stay at an inactive level.

It should be noted that delay in the forward and trailing delay paths is generated by the switching delay of the invertors formed by complementary pFET-nFET pairs in the active signal paths and the total delay is a function of the number of invertors in the path. In the forward path, the upper most path is the default path (set0) path and it has one delay element in the path between the external input clock clkg and the driver of the output clock clkl. An input to set1, set2, or set3 activates the path to which the set is connected, which establishes a logic level at node U that disables the inverter in the default path until the input clock signal propagates through the delay elements of the selected path, thus introducing the selected delay, which is determined by the number of delay elements in the path.

The external clock input clkg is connected to the trailing path, as are the outputs of the set1, set2 and set3 paths. The upper most string of delay elements in the delay path is the default or nominal path, so that the number of delay elements in this path determines the nominal pulse width. If set1, set2, or set3 path is active the logic level at the output of that path blocks propagation of the clock through the trailing path via the FET chain at the external clock input trailing path. When the external clock propagates through an active set1, set2, or set3 active path renders the trailing path input FET chain conducting and allow the external clock signal to propagate along the trailing path. The delay introduced in the trailing path may be increased or may decreased from the nominal value by introducing additional delay elements in the delay path or reducing the number of delay elements in the delay path. In this exemplary embodiment of the invention, pw0, establishes the fastest delay path and thus the narrowest local clock pulse width. If pw1 is set, the number of delay elements is increased by 2 stages and the pulse width is widen as compared to its narrowest value. If pw2 is set, the pulse width is further increased by another four stages.

The output of the trailing path is coupled to node U, causing the local clock output to change from its low active state to a high inactive state until the next transition of the external input clock signal transition from high to low. The output driver stage of the local clock generator consists of large pull down NFET devices n39–n40 which are driven from node W of the leading edge path. The pull up driver consists of parallel connected PFET devices p39 and p40–p41. P39 is driven from node W, hence is responsive to the forward path switching. Its device size is chosen to be smaller than that of p40–p41, so that it reduces loading on node w to ensure faster forward path switching. The parallel PFET devices p40–p41 are much larger than p39, they serve as the main pull up driver. They are driven from node X, which is a parallel path to node W. This combination of parallel path pull up driver enables the clkl output to handle very large load without degrading switching performance.

Figure 4:
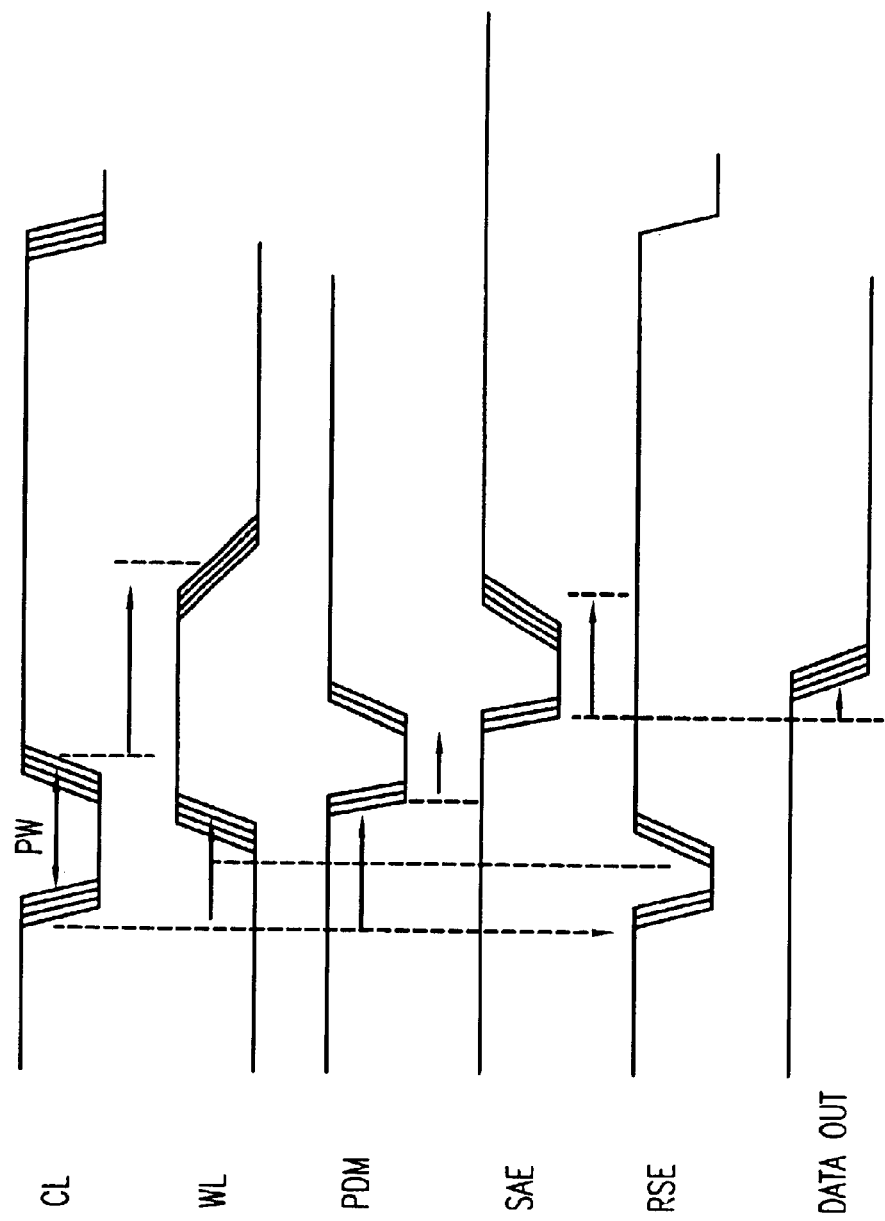
FIG. 4 shows idealized waveforms illustrating timing path options for critical timing functions in an SRAM employing a programmable local clock generator in accordance with the teachings of this invention.

As will be appreciated by those skilled in the art, the period of the external clock signal is much grater than pulse width of the local clock output. FIG. 4 illustrates the range of possible variation in timing of critical timing paths possible with the programmable clock generator of this invention.

While the preferred embodiment of the invention has been described, it will be understood that those skilled in the art, both now and in the future, may make various improvements and enhancements which fall within the scope of the claims which follow. These claims should be construed to maintain the proper protection for the invention first described herein.

What is claimed is:

1. A high performance SRAM array local clock generator comprising in combination:
   a forward delay path extending from a global clock input to a local clock output in order to establish a leading edge of said local clock signal;
   at least one additional delay element set that can be inserted in said forward delay path in response to scan bits in order to delay the propagation of said global clock signal along said forward delay path;
   a trailing delay path extending from said global clock input to said local clock output in order to establish a trailing edge of said local clock signal;
   at least another additional delay element set that can be inserted in said trailing delay path in response to scan bits in order to delay the propagation of said global clock signal along said trailing delay path;
   a connection between said forward delay path and said trailing delay path that inhibits the introduction of said global clock signal into said trailing delay path by an amount that is a function of the delay introduced by said forward delay path.

2. A high performance SRAM array local clock generator as in claim 1 wherein said forward delay path has a plurality of delay element sets any one of which can be inserted in said forward delay path in response to said scan bits.

3. A high performance SRAM array local clock generator as in claim 1 wherein said trailing delay path has a plurality of delay element sets any one of which can be inserted in said trailing delay path in response to said scan bits.

4. A high performance SRAM array local clock generator as in claim 2 wherein said trailing delay path has a second plurality of delay element sets any one of which can be inserted in said trailing delay path in response to said scan bits.

5. A high performance SRAM array local clock generator as in claim 4 wherein said delay element sets are comprised of FET invertors.

* * * * *